(12) United States Patent
Chiao (10) Patent No.: US 8,711,627 B2
(45) Date of Patent: Apr. 29, 2014

(54) DATA STORAGE DEVICE AND BLOCK SELECTION METHOD FOR A FLASH MEMORY

(75) Inventor: Mong-Ling Chiao, Taipei (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 282 days.

(21) Appl. No.: 13/432,887

(22) Filed: Mar. 28, 2012

(65) Prior Publication Data

US 2012/0268991 A1  Oct. 25, 2012

(30) Foreign Application Priority Data

Apr. 22, 2011 (TW) .............................. 100114003 A (51) Int. Cl.
*G11C 16/04* (2006.01)
(52) U.S. Cl.
USPC ............. 365/185.11; 365/185.08; 365/189.07
(58) Field of Classification Search
CPC ......... G11C 29/765; G11C 16/08; G11C 8/12
USPC ............................ 365/185.11, 185.08, 189.07
See application file for complete search history.

(56) References Cited

U.S. PATENT DOCUMENTS

| 7,397,707 B2* | 7/2008 | Mokhlesi ................. 365/185.33 |
| 7,975,119 B2 | 7/2011 | Erez | |
| 8,140,739 B2* | 3/2012 | Langlois et al. .............. 365/158 |
| 8,190,842 B2* | 5/2012 | Frost et al. ............... 365/185.25 |
| 2010/0177553 A1 | 7/2010 | Lee et al. | |

FOREIGN PATENT DOCUMENTS

| TW | 200531069 | 9/2005 |
| TW | 200739342 | 10/2007 |
| TW | 200822124 | 5/2008 |

OTHER PUBLICATIONS

English language translation of abstract of TW 200531069 (published Sep. 16, 2005).
English language translation of abstract of TW 200739342 (published Oct. 16, 2007).
English language translation of abstract of TW 200822124 (published May 16, 2008).

\* cited by examiner

*Primary Examiner* — Tuan T Nguyen
(74) *Attorney, Agent, or Firm* — McClure, Qualey & Rodack, LLP (57) ABSTRACT

The invention provides a block selection method for a flash memory. First, a flash memory is divided into a plurality of great block groups. Each of the great block groups is then divided into a plurality of block groups. Scores corresponding to the blocks of the flash memory are then recorded in a score table. When the score of a target block selected from the blocks of the flash memory has been amended, the amended score of the target block is compared with a first extreme value and a second extreme value corresponding to the block group and the great block group comprising the target block and the total extreme value. A victim block is then determined from the blocks of the flash memory according to an extreme value table.

16 Claims, 9 Drawing Sheets

| Block group | $A_1$ | $A_2$ | ... | $A_K$ | $B_1$ | $B_2$ | ... | $B_K$ | ... | $N_1$ | $N_2$ | ... | $N_K$ |
|---|---|---|---|---|---|---|---|---|---|---|---|---|---|
| Extreme value of score of block group | $X_{A1}$ | $X_{A2}$ | ... | $X_{AK}$ | $X_{B1}$ | $X_{B2}$ | ... | $X_{BK}$ | ... | $X_{N1}$ | $X_{N2}$ | ... | $X_{NK}$ |
| Great block group | A | | | | B | | | | ... | N | | | |
| Extreme value of score of great block group | $X_A$ | | | | $X_B$ | | | | ... | $X_N$ | | | |
| Total extreme value | $X_{Total}$ | | | | | | | | | | | | |

# DATA STORAGE DEVICE AND BLOCK SELECTION METHOD FOR A FLASH MEMORY

CROSS REFERENCE TO RELATED APPLICATIONS

This Application claims priority of Taiwan Patent Application No. 100114003, filed on Apr. 22, 2011, the entirety of which is incorporated by reference herein.

BACKGROUND OF THE INVENTION

1. Field of the Invention

The invention relates to flash memories, and more particularly to block selection of flash memories.

2. Description of the Related Art

A flash memory comprises a plurality of blocks, and each of the blocks comprises a plurality of pages for data storage. When a controller wants to write data to a flash memory, the controller must select a target block from a plurality of blocks of the flash memory, and then after, the controller writes data to the target block. To manage data stored in the flash memory, the controller sometimes must select a target block from the blocks of the flash memory and then erase data stored in the target block. The target block from which data is erased is referred to as a victim block. The controller often needs to select a victim block from the flash memory.

Ordinarily, the controller selects a victim block according to scores of the blocks of the flash memory. The controller first evaluates scores of all blocks of the flash memory and then determines the victim block according to the evaluated scores. For example, the controller may determine a block with a maximum score to be a victim block. In another embodiment, the controller may determine a block with a minimum score to be a victim block. The controller therefore must determine an extreme value of the scores of the blocks before a victim block is determined.

Determination of an extreme value of scores of all blocks of a flash memory is not an easy task. First, the controller must maintain the scores of the blocks. In addition, the controller must determine the extreme value of the scores within a short time period. For example, according to the specification of the flash memory, when the host sends a write command to the controller, the controller must complete data writing to the flash memory in a time period of 200 ms. The controller therefore cannot expend a time period longer than 200 ms in determination of the extreme value of the scores of blocks of the flash memory.

Figure 1A:
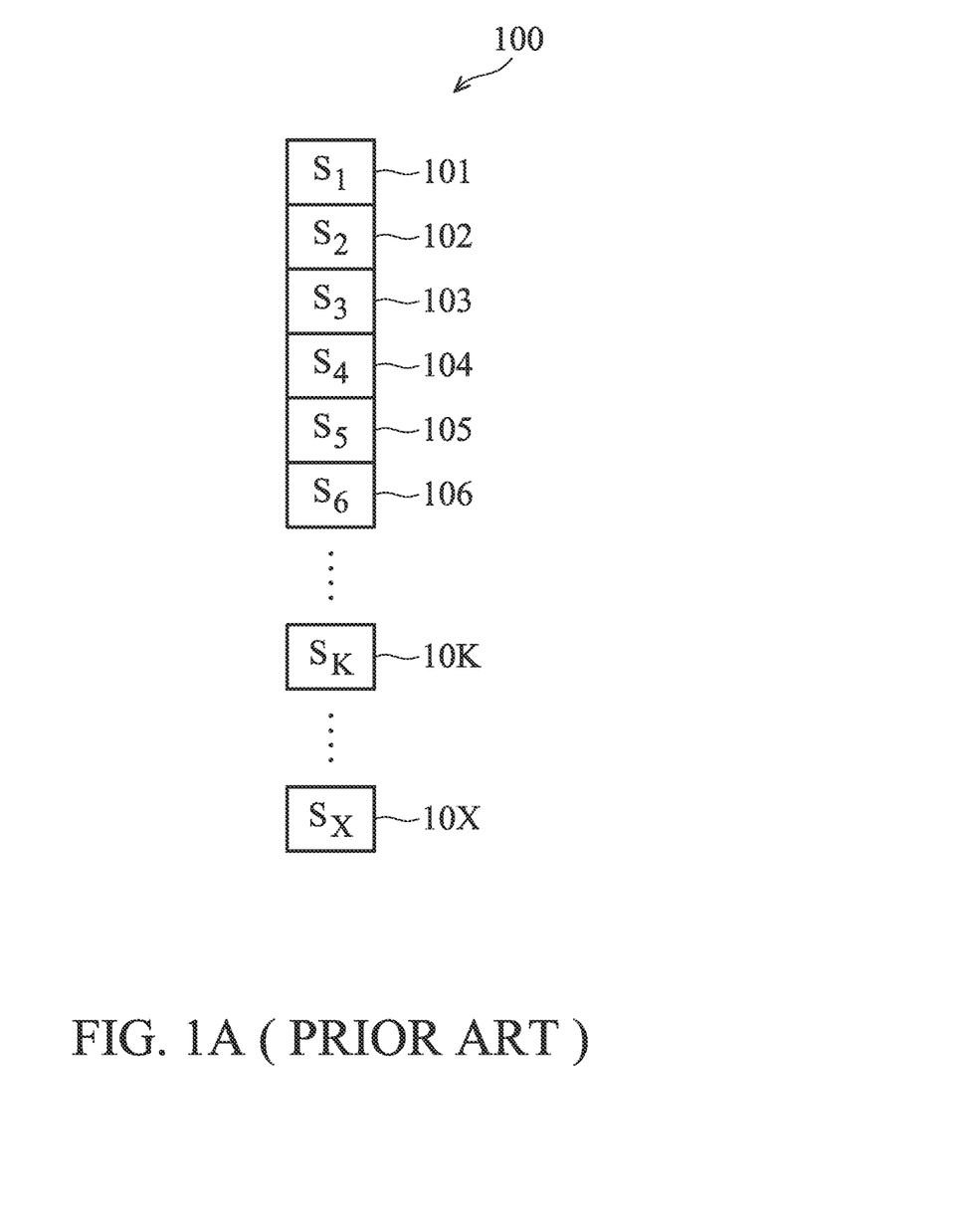
FIG. 1A is a schematic diagram of scores stored in a queue.

The time expended by a controller to determine an extreme value of scores corresponds to the data structure for storing the scores of the blocks. Referring to FIG. 1A, a schematic diagram of scores stored in a queue 100 is shown. Scores $S_1 \sim S_X$ of X blocks are sequentially stored in data storage units 101~10X, and a controller must sequentially search the data storage units 101~10X to determine an extreme value of the scores $S_1 \sim S_X$. The controller therefore needs a long time period to determine the extreme value of the scores $S_1 \sim S_X$ stored in the data storage units 101~10X of the queue.

Figure 1B:
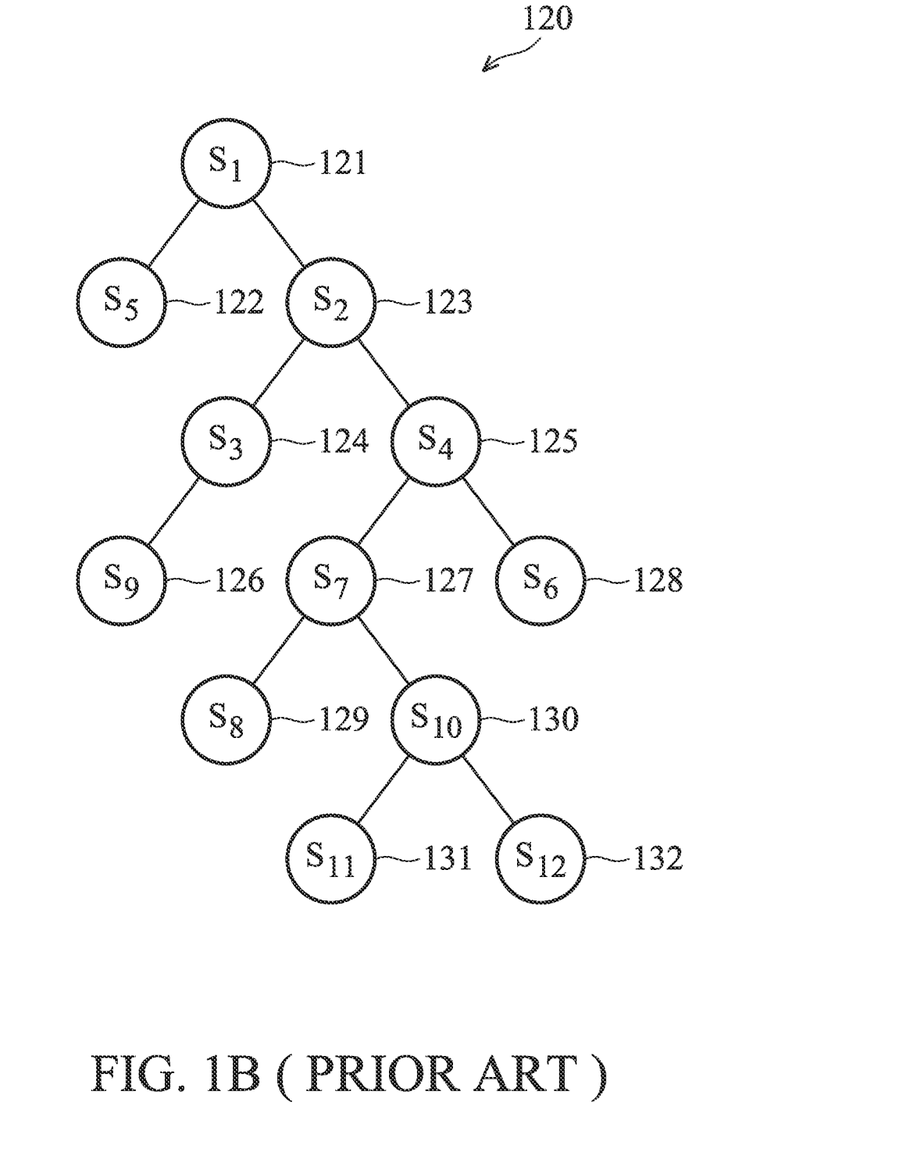
FIG. 1B is a schematic diagram of scores stored in a binary tree.

Referring to FIG. 1B, a schematic diagram of scores stored in a binary tree 120 is shown. A root node divides a binary tree 120 into a left subtree and a right subtree, wherein data stored in the nodes of the left subtree is smaller than data stored in the root node, but data stored in the nodes of the right subtree is greater than data stored in the root node. The extreme value is therefore stored in the node located at the lower-right corner of the binary tree 120. For example, the extreme value of the scores $S_1 \sim S_{12}$ is the score $S_{12}$ stored in the lower-right node 132 of the binary tree 120. Although it is easier to find the extreme value of scores stored in a binary tree than that stored in a queue, the storage of scores into the binary tree also takes a long time period. For example, when a controller wants to store the score $S_{12}$ into the binary tree 120, the score $S_{12}$ must be sequentially compared with the scores stored in the nodes 121, 123, 125, 127, and 130, and a long time period is therefore needed.

Thus, a data structure is required to make a controller to record scores of blocks of a flash memory in the data structure in a short time period and to find an extreme value of scores stored in the data structure in a short time period.

BRIEF SUMMARY OF THE INVENTION

The invention provides a block selection method for a flash memory. First, a flash memory is divided into a plurality of great block groups, wherein each of the great block group comprises a first number of blocks. Each of the great block groups is then divided into a plurality of block groups, wherein each of the block groups comprise a second number of blocks. Scores corresponding to the blocks of the flash memory are then recorded in a score table. A plurality of first extreme values of the scores corresponding to the blocks of each of the block groups, a plurality of second extreme values of the scores corresponding to the blocks of each of the great block groups, and a total extreme value of the scores corresponding to the blocks of the flash memory are then recorded in an extreme value table. When the score of a target block selected from the blocks of the flash memory has been amended, the amended score of the target block is compared with the first extreme value and the second extreme value corresponding to the block group and the great block group comprising the target block and the total extreme value to determine whether the first extreme value and the second extreme value corresponding to the block group and the great block group comprising the target block and the total extreme value were amended to be equal to the score of the target block. A victim block is then determined from the blocks of the flash memory according to the extreme value table.

The invention provides a data storage device. In one embodiment, the data storage device comprises a flash memory, a random access memory, and a controller. The flash memory comprises a plurality of great block groups, wherein each of the great block groups comprises a first number of block groups, and each of the block groups comprise a second number of blocks. The random access memory stores a score table and an extreme value table, wherein the score table records scores corresponding to the blocks of the flash memory, and the extreme value table records a plurality of first extreme values of the scores corresponding to the blocks of each of the block groups, a plurality of second extreme values of the scores corresponding to the blocks of each of the great block groups, and a total extreme value of the scores corresponding to the blocks of the flash memory. The controller determines a victim block from the blocks of the flash memory according to the extreme value table, and when the score of a target block selected from the blocks of the flash memory has been amended, a comparison is performed between the amended score of the target block with the first extreme value and the second extreme value corresponding to the block group and the great block group comprising the target block and the total extreme value to determine whether the first extreme value and the second extreme value corresponding to the block group and the great block group comprising the target block and the total extreme value were amended to be equal to the score of the target block.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
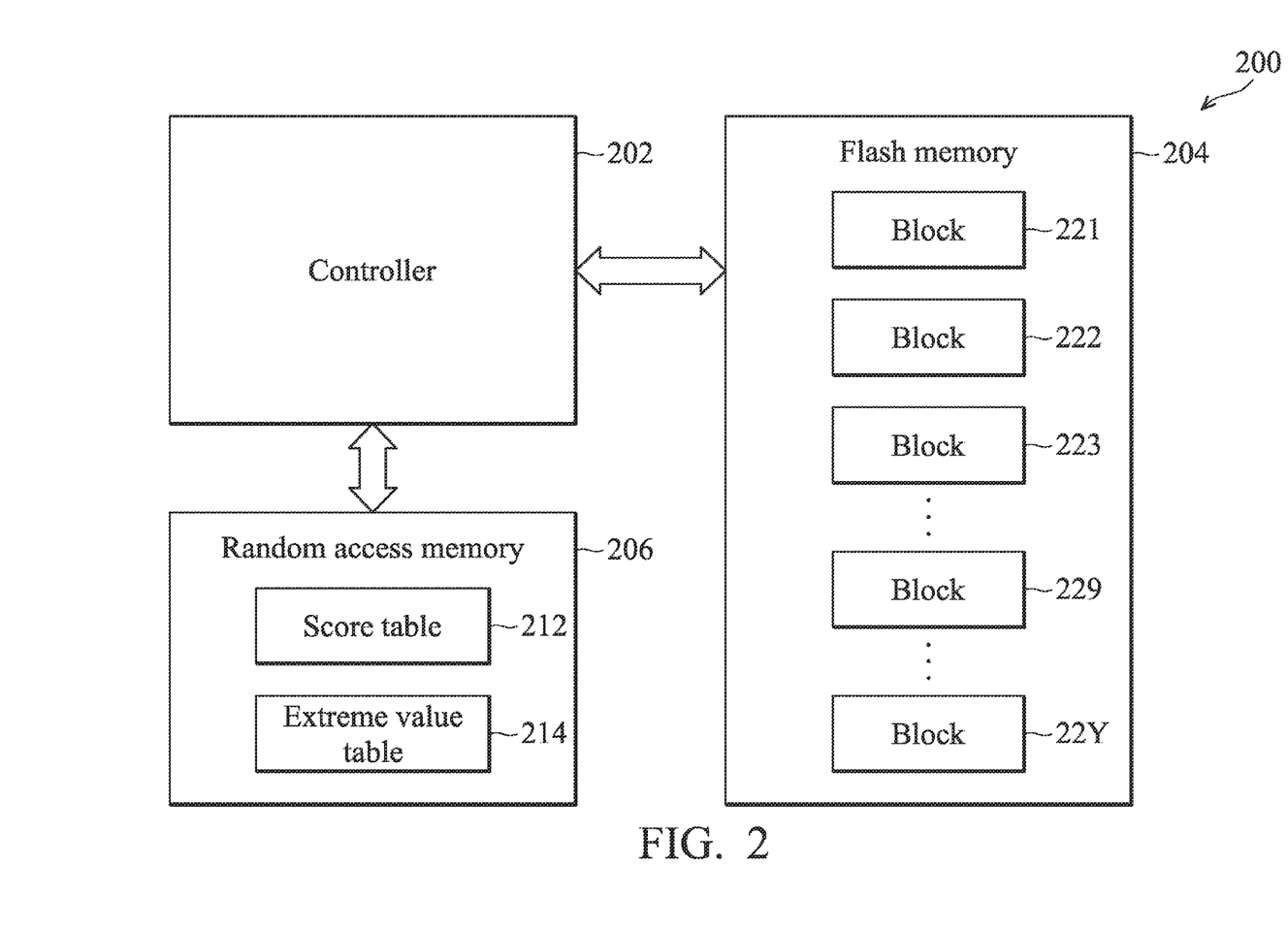
FIG. 2 is a block diagram of a data storage device according to the invention.

Referring to FIG. 2, a block diagram of a data storage device 200 according to the invention is shown. In one embodiment, the data storage device 200 comprises a controller 202, a flash memory 204, and a random access memory 206. The flash memory 204 comprises a plurality of blocks 221~22Y for data storage. The flash memory 204 is divided into a plurality of great block groups, and each of the great block groups is divided into a plurality of block groups which comprise a fixed number of blocks. The random access memory 206 stores a score table 212 and an extreme value table 214. The score table 212 records scores of the blocks 221~22Y of the flash memory 204. The extreme value table 214 records extreme values of scores corresponding to the blocks of the great block groups, the block groups, and the flash memory 204. The extreme values recorded in the extreme value table 214 may be maximum values or minimum values.

The controller 202 maintains the score table 212 and the extreme value table 214. Before a power supplied to the data storage device 200 is turned off, because the random access memory 206 cannot keep the score table 212 and the extreme value table 214 without a supplied power, the controller 202 writes the score table 212 and the extreme value table 214 from the random access memory 206 to a specific block of the flash memory 204. After the power is again supplied to the data storage device 200, the controller 202 reads the score table 212 and the extreme value table 214 from the flash memory 204 and then writes the score table 212 and the extreme value table 214 to the random access memory 206.

When the controller 202 needs to select a victim block from the blocks 221~22Y of the flash memory 204, the controller 202 reads a total extreme value of scores of the blocks 221~22Y of the flash memory 204 from the extreme value table 214, and then determines the block with a score equal to the total extreme value to be the victim block. In one embodiment, the controller 202 then erases data from the victim block. In one embodiment, the scores of the blocks may be erase counts of the blocks or valid page numbers of the blocks. An erase count of a block is a frequency at which the block has been erased, and a valid page count of a block is the number of pages storing valid data in the block. Thus, when a block has a low erase count or a low valid page number, the block is a suitable candidate for the victim block. The controller 202 therefore reads a minimum value of the erase counts or valid page numbers of the blocks 221~22Y from the extreme value table 214, determines the block corresponding to the minimum value of the erase counts or valid page numbers to be the victim block, and then erases data from the victim block.

Figure 3:
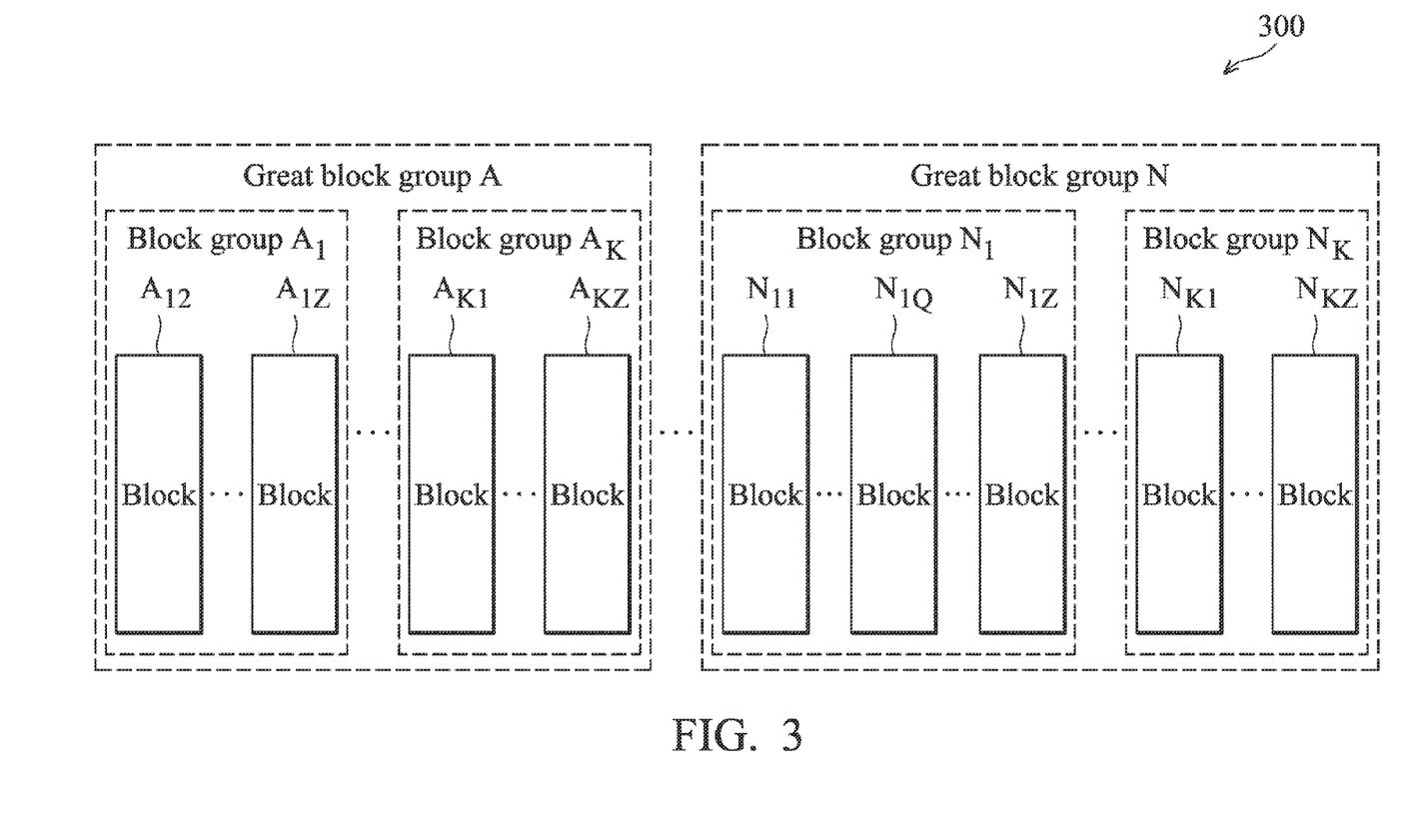
FIG. 3 is a schematic diagram of block groups of a flash memory.

Referring to FIG. 3, a schematic diagram of block groups of a flash memory is shown. The flash memory comprises a plurality of great block groups A~N, wherein each great block group comprises K block groups, and each block group further comprises Z blocks. For example, the great block group A comprises block groups $A_1$~$A_K$, the block group $A_1$ comprises blocks $A_{11}$~$A_{1Z}$, and the block group $A_K$ comprises blocks $A_{K1}$~$A_{KZ}$. The great block group N comprises block groups $N_1$~$N_K$, the block group $N_1$ comprises blocks $N_{11}$~$N_{1Z}$, and the block group $N_K$ comprises blocks $N_{K1}$~$N_{KZ}$. The flash memory therefore has Z×K×N blocks. In one embodiment, Z has a value of 8 ($=2^3$). K has a value of 8 ($=2^3$), N has a value of 256 ($=2^8$), and the flash memory therefore has $2^{14}$ blocks in total.

Figure 4:
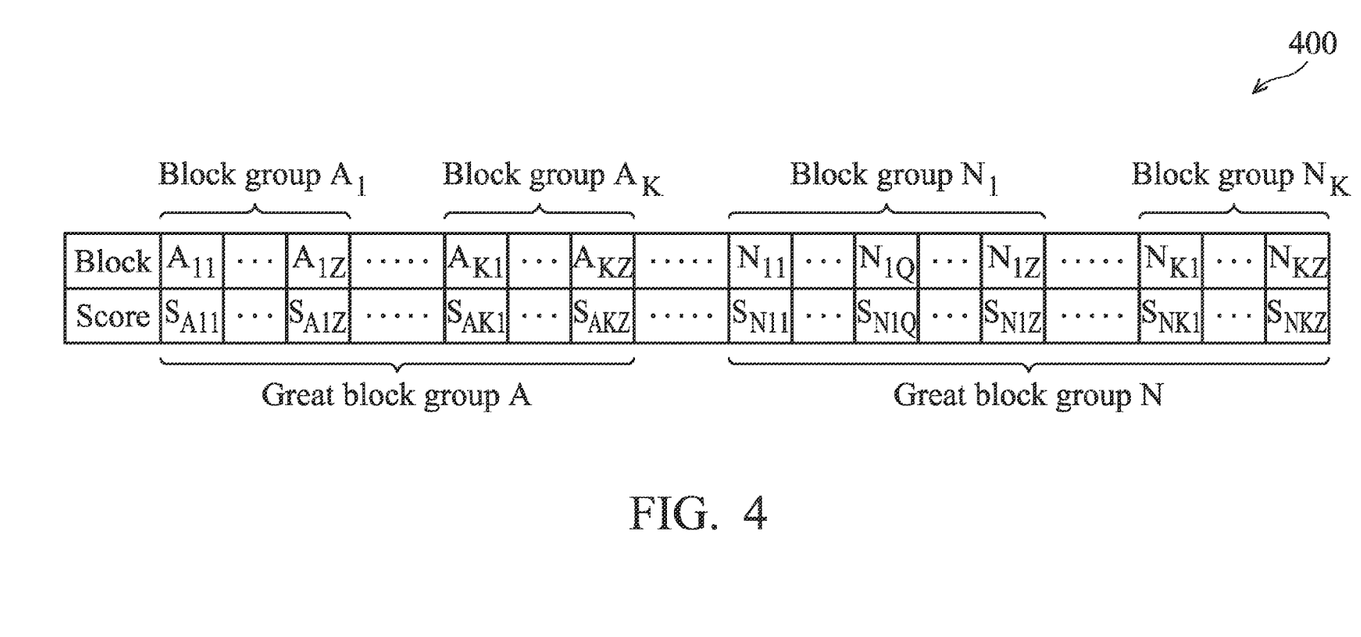
FIG. 4 is a schematic diagram of a score table according to the invention.

Referring to FIG. 4, a schematic diagram of a score table 400 according to the invention is shown. The score table 400 records scores of all blocks of the flash memory. Assume that the flash memory comprises great block groups A~N, each great block group comprises K block groups, and each block group further comprises Z blocks. The score table 400 therefore records scores of Z×K×N blocks. For example, the great block group A comprises block groups $A_1$~$A_K$, the block group $A_1$ comprises blocks $A_{11}$~$A_{1Z}$, the block group $A_K$ comprises blocks $A_{K1}$~$A_{KZ}$, and the score table 400 records the scores $S_{A11}$~$S_{A1Z}$ of the blocks $A_{11}$·$A_{1Z}$ and the scores $S_{AK1}$~$S_{AKZ}$ of the blocks $A_{K1}$~$A_{KZ}$. The great block group N comprises block groups $N_1$~$N_K$, the block group $N_1$ comprises blocks $N_{11}$~$N_{1Z}$, the block group $N_K$ comprises blocks $N_{K1}$~$N_{KZ}$, and the score table 400 records the scores $S_{N11}$~$S_{N1Z}$ of the blocks $N_{11}$~$N_{1Z}$ and the scores $S_{NK1}$~$S_{NKZ}$ of the blocks $N_{K1}$~$N_{KZ}$.

Figure 5:
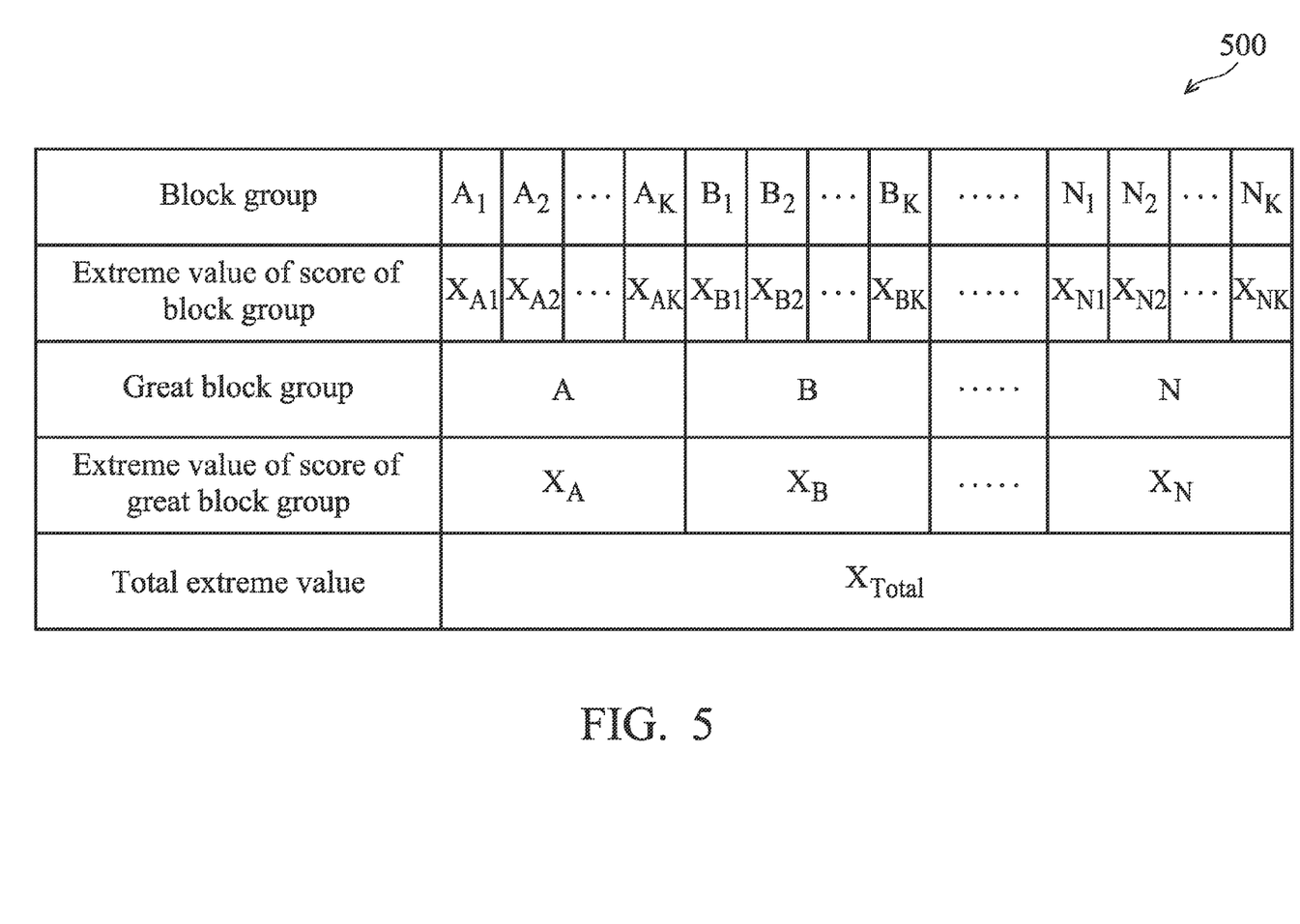
FIG. 5 is a schematic diagram of an extreme value table according to the invention.

Referring to FIG. 5, a schematic diagram of an extreme value table 500 according to the invention is shown. The flash memory comprises great block groups A, B, . . . , N, and each of the great block groups comprises K block groups, and each of the block groups comprises Z blocks. The extreme value table 500 therefore records extreme values of scores of K×N block groups, extreme values $X_A$~$X_N$ of N great block groups, and a total extreme value $X_{Total}$ of all blocks of the flash memory. For example, the great block group A comprises block groups $A_1, A_2, \ldots, A_K$, and the extreme value table 500 records extreme values $X_{A1}, X_{A2}, \ldots, X_{AK}$ of the block groups $A_1, A_2, \ldots, A_K$. The extreme value $X_A$ of the great block group A is then obtained by comparing the extreme values $X_{A1}, X_{A2}, \ldots, X_{AK}$. The great block group N comprises block groups $N_1, N_2, \ldots, N_K$, and the extreme value table 500 records extreme values $X_{N1}, X_{N2}, \ldots, X_{NK}$ of the block groups $N_1, N_2, \ldots, N_K$. The extreme value $X_N$ of the great block group N is then obtained by comparing the extreme values $X_{N1}, X_{N2}, \ldots, X_{NK}$.

Figure 6A:
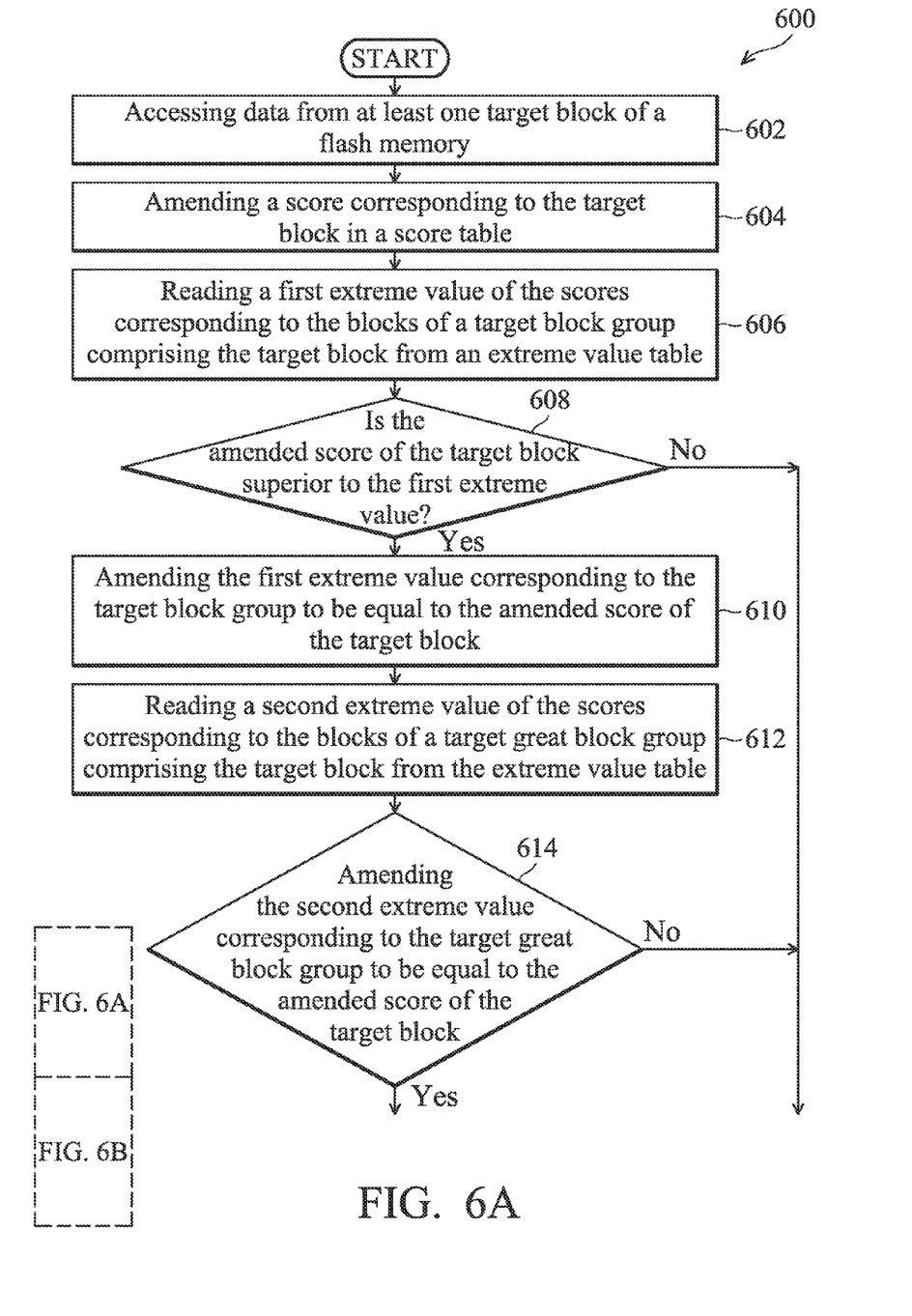
FIG. 6A and FIG. 6B are flowcharts of a method for maintaining an extreme value table according to the invention.
Figure 6B:
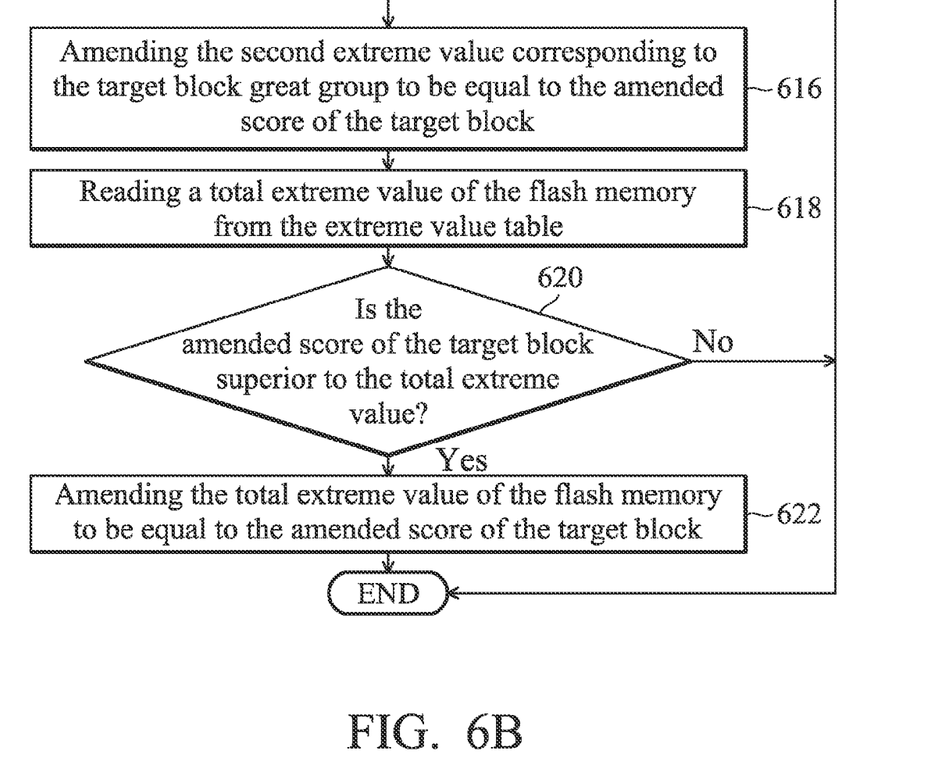

Referring to FIG. 6, a flowchart of a method 600 for maintaining an extreme value table according to the invention is shown. When a score of a target block has been amended, the controller 202 correspondingly amends the extreme value recorded in the extreme value table 214 according to the method 600. First, the controller 202 accesses data from at least one target block of a flash memory (step 602). For example, assume that the target block is the block $N_{1Q}$ belonging to the block group $N_1$ of the great block group N, and the score $S_{N1Q}$ of the $N_{1Q}$ has been amended to be $S_{N1Q}'$. The controller 202 then amends a score corresponding to the target block in a score table 212 stored in the random access memory 206 (step 604). The controller 202 then reads a first extreme value of a target block group comprising the target block from an extreme value table 214 (step 606). The controller 202 then determines whether the amended score of the target block is superior to the first extreme value (step 608). If the amended score of the target block is superior to the first extreme value, the controller 202 amends the first extreme value corresponding to the target block group to be equal to the amended score of the target block (step 610). For example, the block group $N_1$ comprising the target block $N_{1Q}$ has an extreme value $X_{N1}$, and the controller 202 compares the amended score $S_{N1Q}$ of the target block with the extreme value $X_{N1}$. If the amended score $S_{N1Q}$ of the target block is superior to the extreme value $X_{N1}$, the controller 202 amends the extreme value $X_{N1}$ of the block group $N_1$ to be the amended score $S_{N1Q}$ of the target block $N_{1Q}$.

If the amended score of the target block is superior to the first extreme value, the controller 202 then reads a second extreme value of a target great block group comprising the target block from the extreme value table 214 (step 612). The controller 202 then determines whether the amended score of the target block is superior to the second extreme value (step 614). If the amended score of the target block is superior to the second extreme value, the controller 202 amends the second extreme value corresponding to the target great block group to be equal to the amended score of the target block (step 616). For example, the great block group N comprising the target block $N_{1Q}$ has an extreme value $X_N$, and the controller 202 compares the amended score $S_{N1Q}$ of the target block with the extreme value $X_N$. If the amended score $S_{N1Q}$ of the target block is superior to the extreme value $X_N$, the controller 202 amends the extreme value $X_N$ of the great block group N to be the amended score $S_{N1Q}$ of the target block $N_{1Q}$.

If the amended score of the target block is superior to the second extreme value, the controller 202 reads a total extreme value of the flash memory from the extreme value table 214 (step 618). The controller 202 then determines whether the amended score of the target block is superior to the total extreme value (step 620). If the amended score of the target block is superior to the total extreme value, the controller 202 then amends the total extreme value of the flash memory to be equal to the amended score of the target block (step 622). For example, the blocks of the flash memory has a total extreme value $X_{Total}$, and the controller 202 compares the amended score $S_{N1Q}$ of the target block with the total extreme value $X_{Total}$. If the amended score $S_{N1Q}$ of the target block is superior to the total extreme value $X_{Total}$, the controller 202 amends the total extreme value $X_{Total}$ of the flash memory to be the amended score $S_{N1Q}$ of the target block $N_{1Q}$. The controller 202 therefore only needs to compare the amended score $S_{N1Q}$ of the target block $N_{1Q}$ with the extreme value $X_{N1}$ of the block group $N_1$, the extreme value $X_N$ of the great block group N, and the total extreme value $X_{Total}$. In comparison with the prior art shown in FIGS. 1A and 1B, the time period required by the data storage device for maintaining the scores recorded in the score table and the extreme values recorded in the extreme value table is shorter than that of the prior arts shown in FIGS. 1A and 1B. The method 600 provided by the invention is therefore superior to the prior art shown in FIGS. 1A and 1B.

Figure 7:
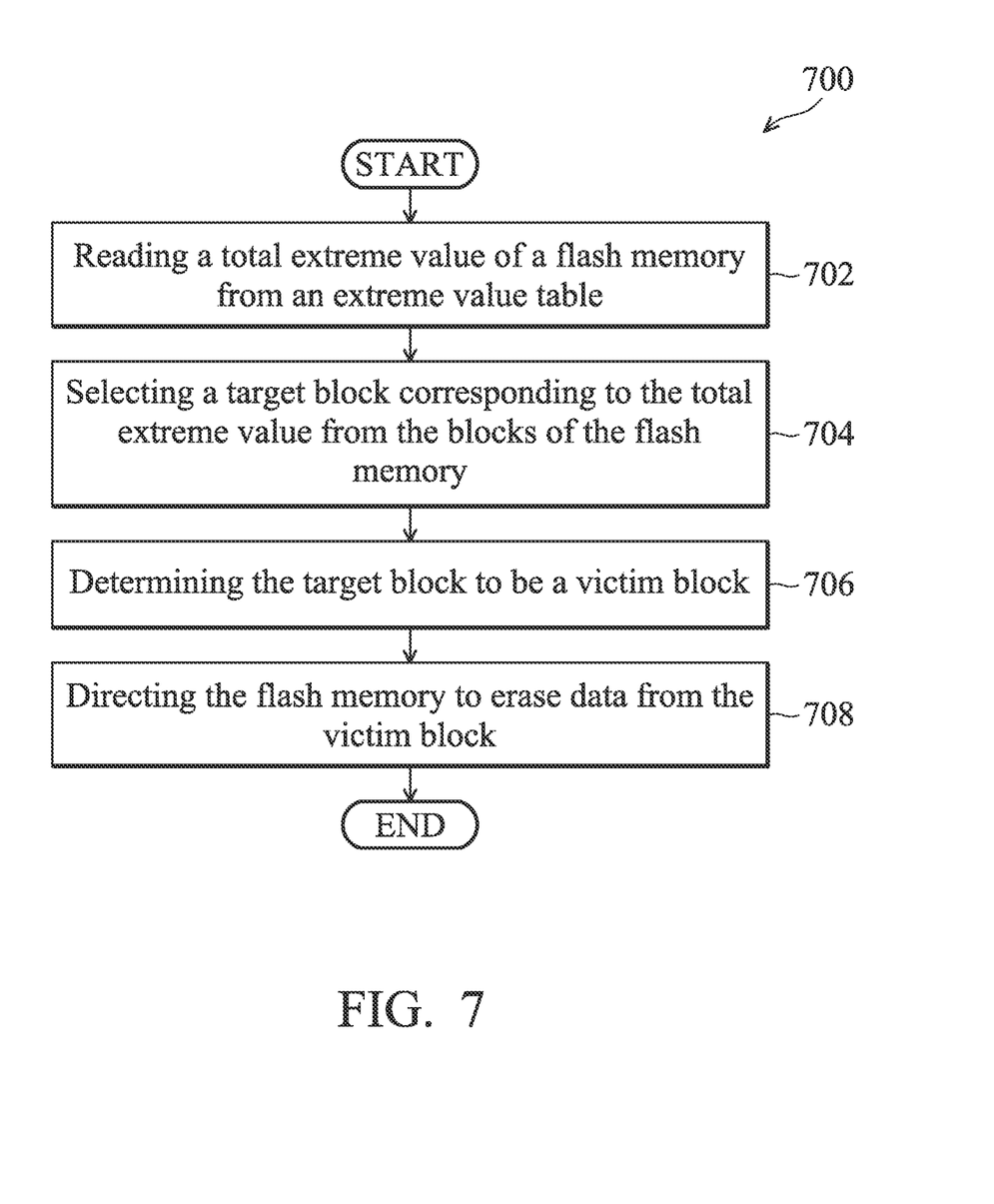
FIG. 7 is a flowchart of a method for selecting a victim block from the blocks of a flash memory according to the invention.

Referring to FIG. 7, a flowchart of a method 700 for selecting a victim block from the blocks of a flash memory 204 according to the invention is shown. First, the controller 202 reads a total extreme value $X_{Total}$ of the flash memory 204 from an extreme value table 214 (step 702). The controller 202 then selects a target block corresponding to the total extreme value $X_{Total}$ from the blocks of the flash memory 204 (step 704). The controller 202 then determines the target block to be a victim block (step 706). The controller 202 then directs the flash memory 204 to erase data from the victim block (step 708). The controller 202 therefore only needs to determine the victim block according to the total extreme value $X_{Total}$ stored in the extreme value table 214. In comparison with the prior arts shown in FIGS. 1A and 1B, the time period required by the data storage device of the invention for determining an extreme value is apparently shorter than those of the prior arts shown in FIGS. 1A and 1B. The method 700 provided by the invention is therefore superior to the prior arts shown in FIGS. 1A and 1B.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A block selection method for a flash memory, comprising:
   dividing a flash memory into a plurality of great block groups, wherein each of the great block groups comprise a first number of blocks;
   dividing each of the great block groups into a plurality of block groups, wherein each of the block groups comprise a second number of blocks;
   recording scores corresponding to the blocks of the flash memory in a score table;
   recording a plurality of first extreme values of the scores corresponding to the blocks of each of the block groups, a plurality of second extreme values of the scores corresponding to the blocks of each of the great block groups, and a total extreme value of the scores corresponding to the blocks of the flash memory in an extreme value table;
   when the score of a target block selected from the blocks of the flash memory has been amended, comparing the amended score of the target block with the first extreme value corresponding to the block group comprising the target block to determine whether the first extreme value corresponding to the block group comprising the target block has been amended to be equal to the score of the target block, comparing the amended score of the target block with the second extreme value corresponding to the great block group comprising the target block to determine whether the second extreme value corresponding to the great block group comprising the target block has been amended to be equal to the score of the target block, and comparing the amended score of the target block with the total extreme value to determine whether the total extreme value has been amended to be equal to the score of the target block; and determining a victim block from the blocks of the flash memory according to the extreme value table.

2. The block selection method as claimed in claim 1, wherein the first extreme values are minimum values of the scores corresponding to the blocks of each of the block groups, the second extreme values are minimum values of the scores corresponding to the blocks of each of the great block groups, and the total extreme value is the minimum value of the scores corresponding to the blocks of the flash memory.

3. The block selection method as claimed in claim 1, wherein the first extreme values are maximum values of the scores corresponding to the blocks of each of the block groups, the second extreme values are maximum values of the scores corresponding to the blocks of each of the great block groups, and the total extreme value is the maximum value of the scores corresponding to the blocks of the flash memory.

4. The block selection method as claimed in claim 1, wherein the comparison of the amended score with the first extreme value, the second extreme value, and the total extreme value comprises:
   reading a target first extreme value of the block group comprising the target block from the extreme value table;
   comparing the amended score of the target block with the target first extreme value;
   when the amended score is superior to the target first extreme value, amending the target first extreme value to be equal to the amended score, and reading a target second extreme value of the great block group comprising the target block from the extreme value table;
   comparing the amended score of the target block with the target second extreme value;
   when the amended score is superior to the target second extreme value, amending the target second extreme value to be equal to the amended score, and reading the total extreme value from the extreme value table;
   comparing the amended score of the target block with the total extreme value; and
   when the amended score is superior to the total extreme value, amending the total extreme value to be equal to the amended score.

5. The block selection method as claimed in claim 1, wherein determination of the victim block comprises:
   reading the total extreme value from the extreme value table;
   selecting the block corresponding to the total extreme value from the blocks of the flash memory to be the victim block;
   directing the flash memory to perform data processing on the victim block.

6. The block selection method as claimed in claim 1, wherein the score table and the extreme value table are stored in a random access memory when a power is supplied to a data storage device comprising the flash memory, and the score table and the extreme value table are stored in a block of the flash memory when the power supplied to the data storage device is turned off.

7. The block selection method as claimed in claim 1, wherein the scores corresponding to the blocks are erase counts of the blocks.

8. The block selection method as claimed in claim 1, wherein the scores corresponding to the blocks are valid page counts of the blocks.

9. A data storage device, comprising:
   a flash memory, comprising a plurality of great block groups, wherein each of the great block groups comprises a first number of block groups, and each of the block groups comprise a second number of blocks;
   a random access memory, storing a score table and an extreme value table, wherein the score table records scores corresponding to the blocks of the flash memory, and the extreme value table records a plurality of first extreme values of the scores corresponding to the blocks of each of the block groups, a plurality of second extreme values of the scores corresponding to the blocks of each of the great block groups, and a total extreme value of the scores corresponding to the blocks of the flash memory; and
   a controller, determining a victim block from the blocks of the flash memory according to the extreme value table, and when the score of a target block selected from the blocks of the flash memory has been amended, comparing the amended score of the target block with the first extreme value corresponding to the block group comprising the target block to determine whether the first extreme value corresponding to the block group comprising the target block has been amended to be equal to the score of the target block, comparing the amended score of the target block with the second extreme value corresponding to the great block group comprising the target block to determine whether the second extreme value corresponding to the great block group comprising the target block has been amended to be equal to the score of the target block, and comparing the amended score of the target block with the total extreme value to determine whether the total extreme value has been amended to be equal to the score of the target block.

10. The data storage device as claimed in claim 9, wherein the first extreme values are minimum values of the scores corresponding to the blocks of each of the block groups, the second extreme values are minimum values of the scores corresponding to the blocks of each of the great block groups, and the total extreme value is the minimum value of the scores corresponding to the blocks of the flash memory.

11. The data storage device as claimed in claim 9, wherein the first extreme values are maximum values of the scores corresponding to the blocks of each of the block groups, the second extreme values are maximum values of the scores corresponding to the blocks of each of the great block groups, and the total extreme value is the maximum value of the scores corresponding to the blocks of the flash memory.

12. The data storage device as claimed in claim 9, wherein when the controller compares the amended score with the first extreme value, the second extreme value, and the total extreme value, the controller reads a target first extreme value of the block group comprising the target block from the extreme value table, compares the amended score of the target block with the target first extreme value, amends the target first extreme value to be equal to the amended score when the amended score is superior to the target first extreme value, and reads a target second extreme value of the great block group comprising the target block from the extreme value table, compares the amended score of the target block with the target second extreme value, amends the target second extreme value to be equal to the amended score when the amended score is superior to the target second extreme value, reads the total extreme value from the extreme value table, compares the amended score of the target block with the total extreme value, and amends the total extreme value to be equal to the amended score when the amended score is superior to the total extreme value.

13. The data storage device as claimed in claim 9, wherein when the controller determines the victim block, the controller reads the total extreme value from the extreme value table, selects the block corresponding to the total extreme value from the blocks of the flash memory to be the victim block, and directs the flash memory to perform data processing on the victim block.

14. The data storage device as claimed in claim 9, wherein the score table and the extreme value table are stored in a random access memory when a power is supplied to a data storage device comprising the flash memory, and the score table and the extreme value table are stored in a block of the flash memory when the power supplied to the data storage device is turned off.

15. The data storage device as claimed in claim 9, wherein the scores corresponding to the blocks are erase counts of the blocks.

16. The data storage device as claimed in claim 9, wherein the scores corresponding to the blocks are valid page counts of the blocks.

* * * * *